(12) United States Patent
Hashemi et al.

(10) Patent No.: US 12,550,625 B2
(45) Date of Patent: Feb. 10, 2026

(54) MRAM WITH DOPED SILICON-GERMANIUM-TIN ALLOY ELECTRODES

(71) Applicant: INTERNATIONAL BUSINESS MACHINES CORPORATION, Armonk, NY (US)

(72) Inventors: Pouya Hashemi, Purchase, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 598 days.

(21) Appl. No.: 17/931,664

(22) Filed: Sep. 13, 2022

(65) Prior Publication Data
US 2024/0090339 A1    Mar. 14, 2024

(51) Int. Cl.
*H10N 50/80* (2023.01)
*H10B 61/00* (2023.01)
*H10N 50/01* (2023.01)

(52) U.S. Cl.
CPC ............. *H10N 50/80* (2023.02); *H10B 61/00* (2023.02); *H10N 50/01* (2023.02)

(58) Field of Classification Search
CPC ........ H10N 50/01; H10N 50/10; H10N 50/80; H10B 61/00
See application file for complete search history.

(56) References Cited

U.S. PATENT DOCUMENTS

| | | |
|---|---|---|
| 6,819,586 B1 | 11/2004 | Anthony |
| 7,110,287 B2 | 9/2006 | Huai |
| 7,180,770 B2 | 2/2007 | Perner |
| 8,411,500 B2 | 4/2013 | Gapihan |
| 8,947,915 B2 | 2/2015 | Worledge |
| 9,324,937 B1 | 4/2016 | Annunziata |
| 9,660,179 B1 | 5/2017 | Annunziata et al. |
| 11,004,489 B2 | 5/2021 | Mihajlovic |
| 11,271,034 B2 | 3/2022 | Guo |
| 11,316,104 B2 | 4/2022 | Hashemi et al. |
| 2014/0273284 A1 | 9/2014 | Annunziata |
| 2015/0295165 A1 | 10/2015 | Annunziata |
| 2017/0084819 A1* | 3/2017 | Lu .......................... H10N 50/01 |
| 2020/0066967 A1 | 2/2020 | Suri |

(Continued)

FOREIGN PATENT DOCUMENTS

| | | |
|---|---|---|
| CN | 111146326 A | 5/2020 |
| CN | 119856601 A | 4/2025 |

(Continued)

OTHER PUBLICATIONS

Ghandi, R., et al., "High boron incorporation in selective epitaxial growth of SiGe layers", Journal of Materials Science: Materials in Electronics, vol. 18, pp. 747-751 (Year: 2007).*

(Continued)

*Primary Examiner* — Fernando L Toledo
*Assistant Examiner* — Ryan T. Fortin
(74) *Attorney, Agent, or Firm* — Jeffrey M. Ingalls

(57) ABSTRACT

Embodiments of the present disclosure relate to a semiconductor device. The semiconductor device includes a bottom electrode, a magnetic tunnel junction (MTJ) stack on the bottom electrode, and a top electrode on the MTJ stack. At least one of the bottom electrode and the top electrode includes doped SiGeSn.

20 Claims, 12 Drawing Sheets

(56) References Cited

U.S. PATENT DOCUMENTS

| | | | |
|---|---|---|---|
| 2020/0212292 A1* | 7/2020 | Cheng | H10N 50/85 |
| 2020/0312839 A1 | 10/2020 | Majhi | |
| 2020/0402559 A1 | 12/2020 | Mihajlovic et al. | |
| 2021/0287960 A1 | 9/2021 | Economy | |
| 2021/0408114 A1* | 12/2021 | Lille | H10B 61/10 |
| 2022/0199898 A1 | 6/2022 | Hashemi et al. | |
| 2023/0029046 A1* | 1/2023 | Chung | H10D 30/43 |
| 2023/0170403 A1* | 6/2023 | Tsou | H10N 50/01 |
| | | | 257/173 |

FOREIGN PATENT DOCUMENTS

| | | |
|---|---|---|
| DE | 112023003810 T5 | 6/2025 |
| EP | 2447948 B1 | 12/2014 |
| GB | 2635303 A | 5/2025 |
| WO | 2020/263318 A1 | 12/2020 |
| WO | 2021181172 A1 | 9/2021 |
| WO | 2024/055891 A1 | 3/2024 |

OTHER PUBLICATIONS

Asheghi et al., "Thermal conduction in doped single-crystal silicon films", Journal of Applied Physics, vol. 91, No. 8, Apr. 15, 2002, 10 pages.

Hahn et al., "Engineering the Thermal Conductivity of Doped SiGe by Mass Variance: A First-Principles Proof of Concept", Frontiers in Mechanical Engineering 7:712989, DOI:10.3389/fmech.2021.712989, Jul. 2021, 09 pages.

Intellectual Property Office, "Patents Act 1977: Search Report under Section 18(3)", Apr. 3, 2025, 05 Pages, GB Application No. 2503721.9.

International Searching Authority, "Notification of Transmittal of the International Search Report and the Written Opinion of the International Searching Authority, or Declaration,"Patent Cooperation Treaty, Nov. 21, 2023, 08 pages, International Application No. PCT/ IB2025/050174.

Khatami et al., "Lattice Thermal Conductivity of the Binary and Ternary Group-IV Alloys Si—Sn, Ge—Sn, and Si—Ge—Sn", Article in Physical Review Applied, Jul. 2016, 12 pages.

* cited by examiner

MRAM WITH DOPED SILICON-GERMANIUM-TIN ALLOY ELECTRODES

BACKGROUND

The present disclosure relates to magnetic random access memory (MRAM) devices based on perpendicular magnetic tunnel junction (MTJ) structures. Certain MRAM devices may be fabricated to include an MTJ stack including a bottom electrode, an MRAM stack, and a top electrode. In general, MRAM devices may be used in a variety of applications. One example application is embedded storage (e.g., eFlash replacement). Another example is cache (e.g., embedded dynamic random-access memory (eDRAM), or static random-access memory (SRAM)). Certain MTJ structures include a Co-based synthetic anti-ferromagnet (SAF), a CoFeB-based reference layer, a MgO-based tunnel barrier, a CoFeB-based free layer, and cap layers containing, for example, Ta and/or Ru. Embedded MTJ structures are usually formed by subtractive patterning of blanket MTJ stacks into pillars between two metal levels. MTJ structures may benefit from an increased junction temperature due to Joule heating during a writing operation, which may reduce the write current without affecting retention.

SUMMARY

Embodiments of the present disclosure relate to a semiconductor device. The semiconductor device includes a bottom electrode, a magnetic tunnel junction (MTJ) stack on the bottom electrode, and a top electrode on the MTJ stack. At least one of the bottom electrode and the top electrode includes doped SiGeSn.

Other embodiments relate to a method of manufacturing a semiconductor device. The method includes forming a bottom electrode, forming a magnetic tunnel junction (MTJ) stack on the bottom electrode, and forming a top electrode on the MTJ stack. At least one of the bottom electrode and the top electrode includes doped SiGeSn.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, explain the principles of the disclosure. The drawings are only illustrative of certain embodiments and do not limit the disclosure.

DETAILED DESCRIPTION

Figure 1:
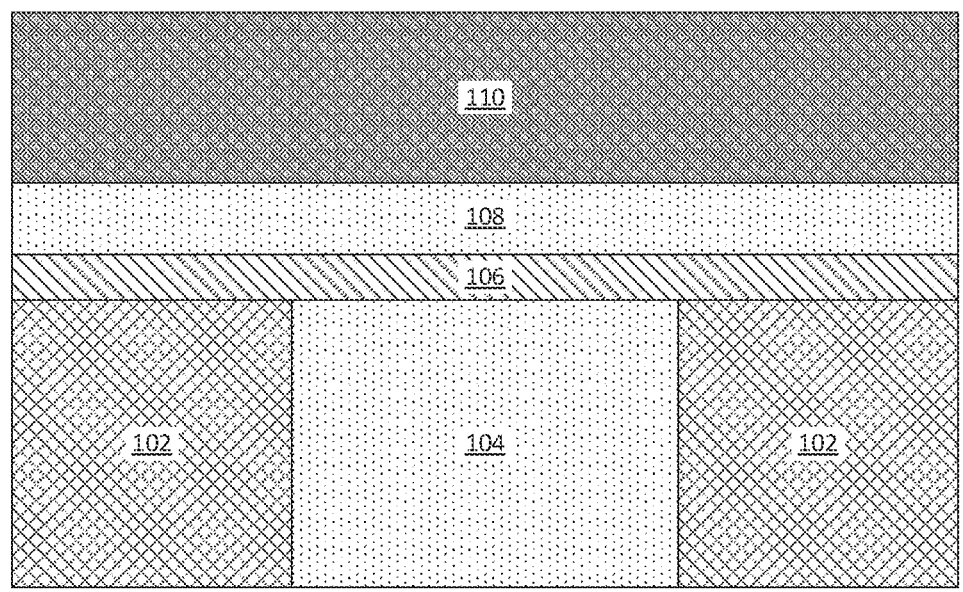
FIG. 1 is a cross-sectional view of a semiconductor device that includes an MRAM device including a bilayer dielectric surrounding the bottom electrode contact (BEC), at an intermediate stage of the manufacturing process, according to embodiments.

The present disclosure describes MRAM devices including magnetic tunnel junction ("MTJ") stacks and methods of manufacturing MRAM devices. In particular, the present disclosure describes MRAM devices and methods of manufacturing same, where the MRAM devices include a thermal isolation structure for MTJ memories.

In general, for the electrodes of a MTJ stack, conductive metal materials such as Ta or TiN are used. However, in the present embodiments a semiconductor material (i.e., as opposed to a conducting material of related devices) is used for the electrodes. For example, a doped silicon-Germanium-Tin (SiGeSn) alloy may be used for the electrodes of the MRAM devices of the present embodiments. The doped SiGeSn may not have as high of an electrical conductivity as related conductive metals (although the conductivity is still high enough for the device to function properly). However, one benefit of using the SiGeSn composition is that the thermal conductivity is generally lower than with the traditional metal conductors used for the electrodes. In general, the upper and lower electrodes of an MTJ stack are connected to metal lines of the MRAM device (e.g., the front end of line (FEOL), middle of line (MOL), and back end of line (BEOL)). If the electrodes are composed of a metal conductor having high thermal conductivity, then the heat generated in the MJT stack is transferred relatively quickly into the metal lines (e.g., of the BEOL layer). Also, in general, the higher the temperature of the MTJ stack, the easier it is to switch the MTJ stack. Therefore, it may be beneficial to keep heat in the MTJ stack for improved switching performance. As such, the doped semiconducting SiGeSn electrodes of the present embodiments have a lower coefficient of heat transfer that allows for a reduction in heat transfer from the MTJ stack to the surrounding metal lines. This results in a higher operating temperature of the MTJ stack and improved performance characteristics.

One effect of the present embodiments is that there are no structural changes required to the MTJ stack to improve the thermal isolation properties of the device. The present embodiments also provide devices with improved thermal isolation. Also, there are no changes required for the encapsulation or other processes that are adjacent to the MTJ stack. In certain embodiments, doped SiGeSn semiconductor contacts are used that will have good electrical conduction but poor thermal conduction while maintaining BEOL compatible deposition temperatures. In certain embodiments, there are a broad range of Silicon, Germanium and Tin (Sn) compositions. Low Ge content (SiSn in the extreme) compounds have lower thermal conductivity for this ternary compound. However, to make the deposition temperature compatible with BEOL processes, Ge is added to the compound. Moreover, the Sn helps with increased electric conductivity of this material. In certain examples, the material can be grown using MOCVD, PECVD, and other low-temperature compatible deposition methods. The bottom via can be formed on metallic vias by recess and fill/CMP or blanket and subtractive via formation. In certain embodiments, the fill/CMP highly p-doped ($p^{++}$) SiGeSn (e.g., doped with boron, gallium, Al, etc.) can be used for the pedestal, the top electrode and the bottom electrode.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") are between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, embedded DRAM (eDRAM) is a dynamic random-access memory (DRAM) integrated on the same die or multi-chip module (MCM) of an application-specific integrated circuit (ASIC) or microprocessor. eDRAM has been implemented in silicon-on-insulator (SOI) technology, which refers to the use of a layered silicon-insulator-silicon substrate in place of conventional silicon substrates in semiconductor manufacturing. eDRAM technology has met with varying degrees of success, and demand for SOI technology as a server memory option has decreased in recent years. Magnetoresistive random-access memory (MRAM) devices using magnetic tunnel junctions (MTJ) are one option to replace existing eDRAM technologies. MRAM is a non-volatile memory, and this benefit is a driving factor that is accelerating the development of this memory technology.

A magnetic tunnel junction (MTJ) device, which is a primary storage element in a magnetic random access memory (MRAM), is a magnetic storage and switching device in which two ferromagnetic layers are separated by a thin insulating oxide layer (i.e., a tunnel barrier layer) to form a stacked structure. The tunnel barrier layer may comprise, for example, magnesium oxide or aluminum oxide. One of the ferromagnetic layers has a magnetization that is fixed, and it is therefore referred to as a magnetic fixed layer (or pinned layer, or reference layer). However, the other ferromagnetic layer has a magnetization that can change, and it is therefore referred to as a free layer (or magnetic free layer). When a bias is applied to the MTJ device, electrons that are spin polarized by the ferromagnetic layers traverse the insulating tunnel barrier layer through a process known as quantum tunneling to generate an electric current whose magnitude depends on an orientation of magnetization of the ferromagnetic layers. The MTJ device will exhibit a low resistance when a magnetic moment of the free layer is parallel to the fixed layer magnetic moment, and it will exhibit a high resistance when the magnetic moment of the free layer is oriented anti-parallel to the fixed layer magnetic moment.

The materials and geometries used to build the stack of different layers forming the MTJ device are factors that affect the characteristics of the device in terms of speed (i.e., switching time) and power consumption (e.g., voltage and/or current required to switch the device from one state to another). As discussed briefly above, certain MTJ devices have a pillar structure (i.e., a stack of materials) having a cylindrical shape, where current flows from a top layer to a bottom layer, or vice versa, in order to switch the magnetization of one ferromagnetic layer. These types of MTJ devices are generally referred to as spin transfer torque (STT) MTJ devices. Certain STT MRAM devices may have limited switching speed and endurance in comparison to static random access memory (SRAM) devices (i.e., random access memory that retains data bits in its memory as long as power is being supplied). Other types of MTJ devices are referred to as spin orbit torque (SOT) devices. In the SOT type of device, the stacked pillar structure is still cylindrically shaped, but the stack is deposited on top of a heavy metal conductor. In the SOT type of MTJ device, current flows horizontally in this conductor and switches the magnetization of the ferromagnetic layer at the interface.

In STT type MRAM devices, the manufacture of the devices is often performed in conjunction with forming middle-of-line (MOL) or back-end-of-line (BEOL) layers. This may be referred to as embedded MRAM, where the MRAM devices are embedded in, or formed in conjunction with these layers. In general, front-end-of-line (FEOL) refers to the set of process steps that form transistors and other circuit elements (such as resistors and capacitors) that are later connected electrically with middle-of-line (MOL) and back-end-of-line (BEOL) layers. In general, MOL refers to the set of wafer processing steps used to create the structures that provide the local electrical connections between transistors (e.g., gate contact formation). MOL processing generally occurs after FEOL processes and before BEOL processes. In general, the BEOL is the portion of IC fabrication where the individual devices (transistors, capacitors, resistors, etc.) are interconnected with wiring on the wafer.

Referring now to the drawings in which like numerals represent the same or similar elements and initially to FIG. 1, an exemplary method of manufacturing a semiconductor device 100 (i.e., an MRAM device) to which the present embodiments may be applied is shown. In this embodiment, a doped SiGeSn via is formed by a subtractive operation. In certain examples, several back end of line ("BEOL") layers and front end of line (FEOL) layers may be formed. In general, the front-end-of-line (FEOL) is the first portion of IC fabrication where the individual devices (transistors, capacitors, resistors, etc.) are patterned in the semiconductor. FEOL generally covers everything up to (but not including) the deposition of metal interconnect layers. In general, the BEOL is the second portion of IC fabrication where the individual devices (transistors, capacitors, resistors, etc.) are interconnected with wiring on the wafer. The BEOL metal layers (not shown) can include, for example, Cu, TaN, Ta, Ti, TiN, or a combination thereof. A BEOL dielectric layer (not shown) may be formed on the sides of one or more of the BEOL metal layers. The BEOL dielectric layer may be composed of, for example, $SiO_x$, $SiN_x$, SiBCN, low-κ, NBLOK, or any other suitable dielectric material. The structure including the FEOL/BEOL layers may be a starting structure upon which the MRAM devices are formed.

As shown in the semiconductor device 100 of FIG. 1, a first dielectric layer 102 (e.g., in the BEOL) is provided as a base layer into which an interconnect structure of the semiconductor device 100 may be formed. The first dielectric layer 102 may include, for example, $SiO_x$, $SiN_x$, SiBCN, NBLOK, TEOS, low-K or ultra-low-K (ULK) materials, etc. In certain embodiments, an interconnect structure (not shown) may be included in one of the BEOL layers. In the example of FIG. 1, the first dielectric layer 102 may be formed in an x'th level BEOL layer. As shown in FIG. 1, a first metal layer 104 (e.g., a Mx layer metal) is formed. The first metal layer 104 may comprise, for example, Cu, TaN, Ta, Ti, TiN or a combination thereof. In certain embodiments, a metallic etch stop layer 106 is formed on the first dielectric layer 102. The metallic etch stop layer 106 may comprise, for example, Ru. However, it should be appreciated that other suitable metals or metal alloys may be used for the metallic etch stop layer 106. In certain embodiments, a bottom via conductor layer 108 may be formed on the metallic etch stop layer 106. The bottom via conductor layer 108 may comprise one or more suitable conductive materials. In other embodiments, the bottom via conductor layer 108 is not included. As shown in FIG. 1, a thin heavily doped SiGeSn layer 110 (doped with, for example, boron) is formed on the bottom via conductor layer 108. The SiGeSn layer 110 may be metallic or a doped semiconductor material.

Figure 2:
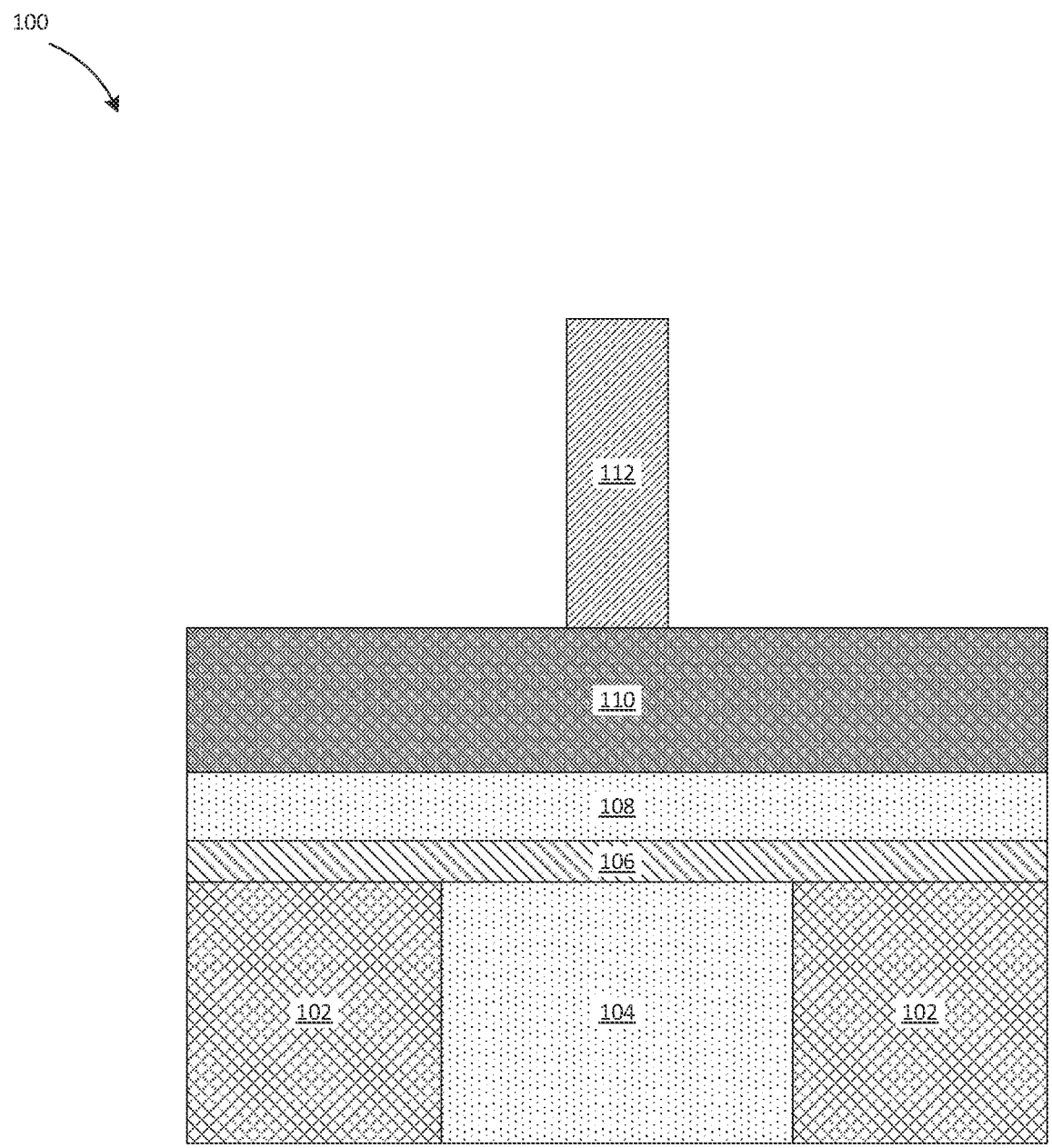
FIG. 2 is a cross-sectional view of the semiconductor device of FIG. 1 after additional fabrication operations, according to embodiments.

The thermal conductivity of undoped SiGeSn can be as low as 1-10 W/mK. However, the thermal conductivity of any system further reduces by increasing doping, which in the present embodiments allows for having a conductive bottom electrode Referring now to FIG. 2, this figure is a cross-sectional view of the semiconductor device of FIG. 1 after additional fabrication operations, according to embodiments. As shown in FIG. 2, a hardmask 112 is formed on the SiGeSn layer 110. In certain embodiments, the hardmask is first deposited, and then patterned using, for example, a combination of lithography and etching (e.g., RIE). As shown in the example of FIG. 2, the hardmask 112 is formed over the first metal layer 104 (i.e., roughly in a center position over the first metal layer 104). In this example, the hardmask 112 is initially formed over the entire semiconductor device 100 as a continuous layer and then subsequently patterned. In certain examples, the material of the hardmask 112 may be TEOS or any other suitable material(s). For example, the hardmask 112 may include one or more of the following materials: TEOS, SiN, SiC, SiON, SiCN, etc.

Figure 3:
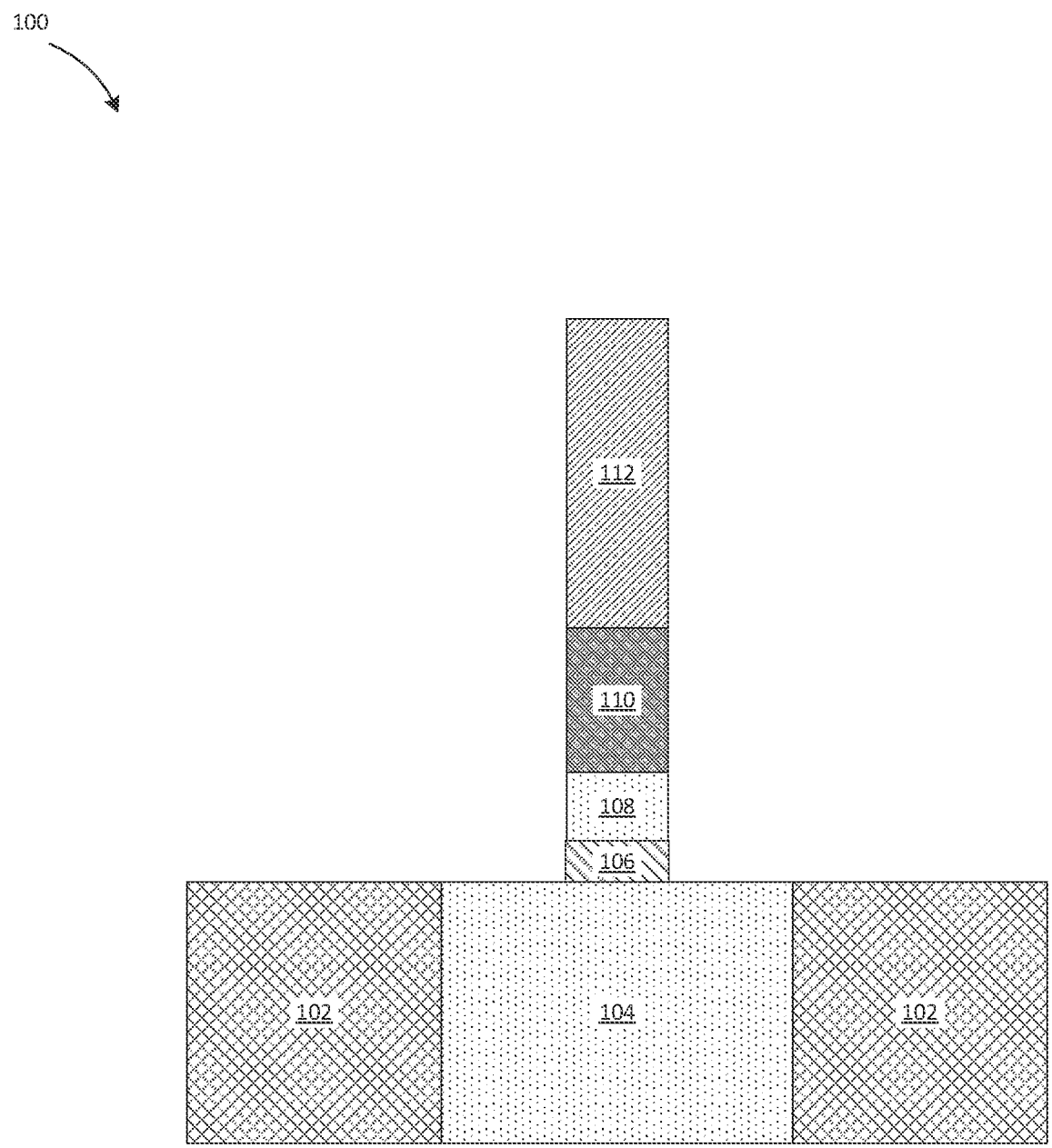
FIG. 3 is a cross-sectional view of the semiconductor device of FIG. 2 after additional fabrication operations, according to embodiments.

Referring now to FIG. 3, this figure is a cross-sectional view of the semiconductor device of FIG. 2 after additional fabrication operations, according to embodiments. As shown in FIG. 3, a suitable material removal process (e.g., RIE) is used to remove certain layers of the semiconductor device 100. In particular, the hardmask 112 is used as a mask to enable removal of the underlying portions of the SiGeSn layer 110 and the bottom via conductor layer 108, while stopping on the metallic etch stop layer 106. In a subsequent fabrication operation, the metallic etch stop layer 106 (e.g., comprising Ru) may be removed with, for example, ion beam etching (IBE) or an Ar based RIE operation. Thus, at this stage of the manufacturing process, the portions of the first dielectric layer 102 and the first metal layer 104 not covered by the hardmask 112 are exposed.

Figure 4:
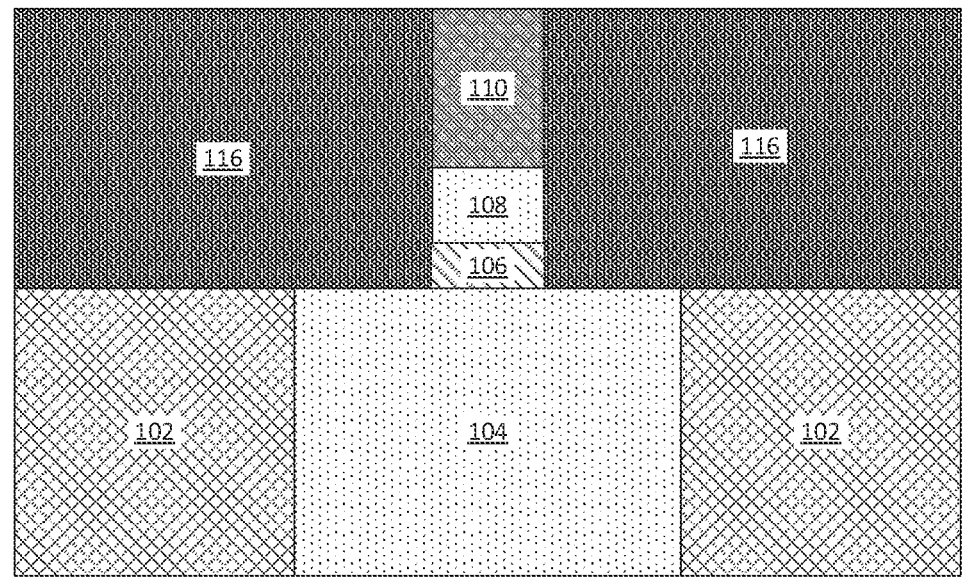
FIG. 4 is a cross-sectional view of the semiconductor device of FIG. 3 after additional fabrication operations, according to embodiments.

Referring now to FIG. 4, this figure is a cross-sectional view of the semiconductor device of FIG. 3 after additional fabrication operations, according to embodiments. As shown in FIG. 4, the hardmask 112 is removed. Then, a via dielectric layer 116 is formed up to or above the upper surface of the SiGeSn layer 110. In certain embodiments, the via dielectric layer 116 may comprise one or more of, for example, SiN, $SiO_x$, SiBCN, SiCOH, etc. However, it should be appreciated that any other suitable dielectric materials may be used to form the via dielectric layer 116 (or fill dielectric layer). Then, in certain embodiments, a material removal process such as CMP may be used to planarize the upper surface of the via dielectric layer 116 and the SiGeSn layer 110. Therefore, a bottom electrode stack is formed from the metallic etch stop layer 106, the bottom via conductor layer 108 and the SiGeSn layer 110.

Figure 5:
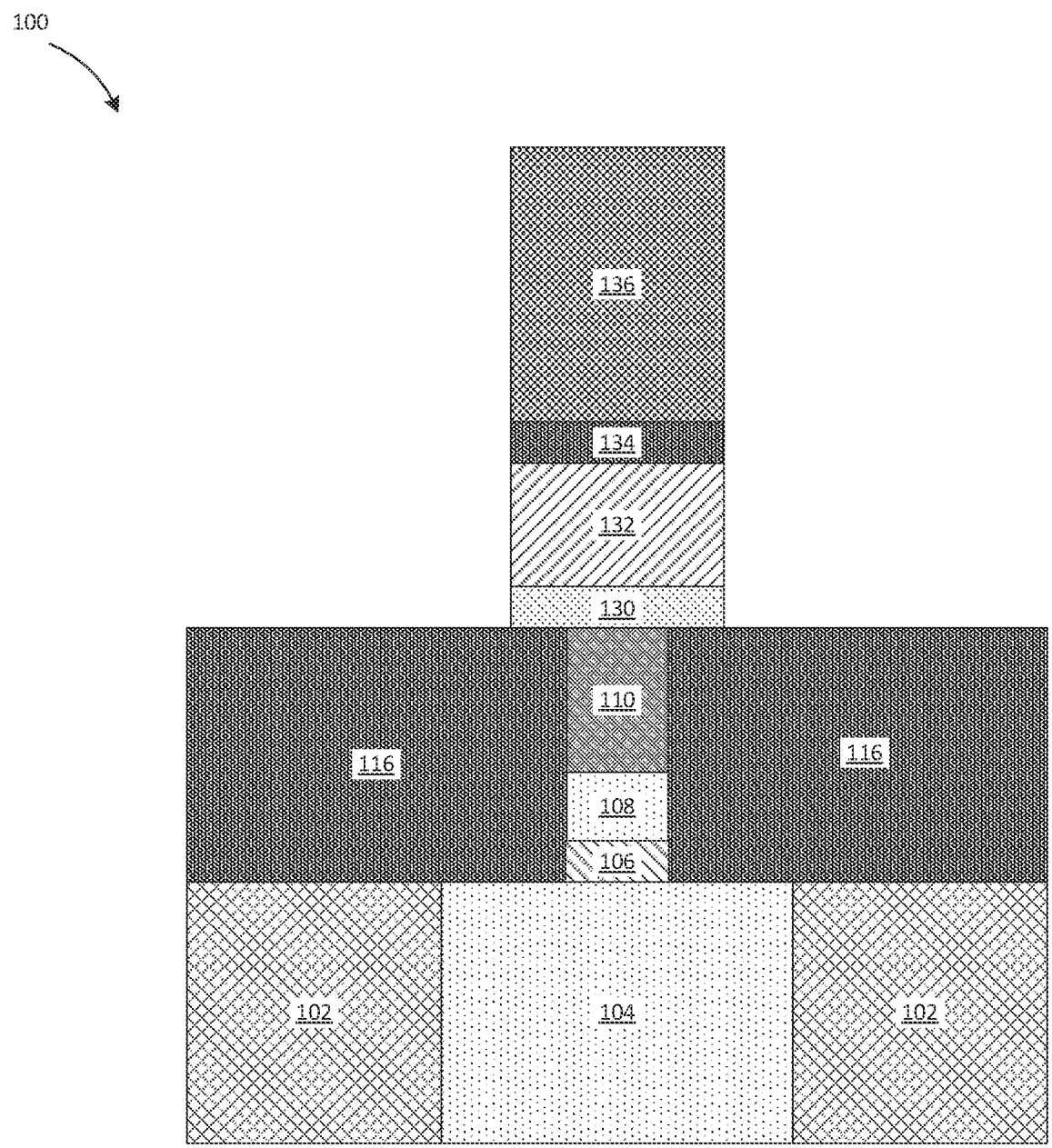
FIG. 5 is a cross-sectional view of the semiconductor device of FIG. 4 after additional fabrication operations, according to embodiments.

Referring now to FIG. 5, this figure is a cross-sectional view of the semiconductor device 100 of FIG. 4 after additional fabrication operations, according to embodiments. As shown in FIG. 5, a pedestal 130 is formed on the SiGeSn layer 110 and on the via dielectric layer 116. In certain embodiments, the pedestal 130 is comprised of the same heavily doped (i.e., $p^{++}$) SiGeSn material as the SiGeSn layer 110. However, it should be appreciated that in other embodiments the pedestal 130 may comprise other materials. In certain examples, the pedestal 130 is wider than the SiGeSn layer 110.

As also shown in FIG. 5, an MTJ stack 132 is formed on the pedestal 130. In general, the MTJ stack 132 may include a magnetic free layer, a tunnel barrier layer and a reference layer (not shown). In general, the magnetic free layers have a magnetic moment or magnetization that can be flipped. In certain embodiments, the tunnel barrier layer is a barrier, such as a thin insulating layer or electric potential, between two electrically conducting materials. Electrons (or quasi-particles) pass through the tunnel barrier by the process of quantum tunneling. In certain embodiments, the tunnel barrier layer includes at least one sublayer composed of MgO. The reference layer (or fixed layer) may, for example, be annealed in a magnetic field to set a polarization state of the reference layer in the MTJ stack 132. In certain embodiments, each layer of the MTJ stack 132 may have a thickness less than an angstrom to a thickness of several angstroms or nanometers. Examples of typical materials in an MTJ stack can include MgO for the tunnel barrier layer, CoFeB for the free layer, and a plurality of layers comprised of different materials for the reference layer. It should be appreciated that the MRAM material stack (MTJ stack) is not limited to these materials, or the layers described above. That is, the MRAM material stack can be composed of any known stack of materials used in MRAM devices. Moreover, it should be appreciated that the MTJ stack 132 may include additional layers, omit certain layers, and each of the layers may include any number of sublayers. In certain embodiments, the MTJ stack 132 can have a combination of ferro and anti-ferromagnetic metals such as Co/Fe/Ni, other metals such as Pt/Ir as well as B. In certain embodiments, the tunnel barrier layer may comprise materials such as MgO, MgAlOx, AlOx, etc.

Next, as shown in FIG. 5, an etch stop metal layer 134 is formed on MTJ stack 132. The etch stop metal layer 134 may comprise, for example, Ru. Then, a top electrode 136 is formed on the etch stop metal layer 134. In certain embodiments, the top electrode 136 is comprised of the same heavily doped (i.e., $p^{++}$) SiGeSn material as the SiGeSn layer 110. However, it should be appreciated that in other embodiments the top electrode 136 may comprise other materials. In certain embodiments, a hardmask (not shown) such as a dielectric hardmask is formed on the top electrode 136. In certain embodiments, the hardmask is a multilayer hardmask. At least initially, the hardmask is formed over the entire semiconductor device 100 as a continuous layer. In certain examples, the material of the hardmask may be TEOS or any other suitable material(s). For example, the hardmask may include one or more of the following materials: TEOS, SiN, SiC, SiON, SiCN etc. Then, a lithographic mask (not shown) is formed that may be used to pattern the MRAM stack. In one example, the lithographic mask is a tri-layer mask including an organic planarizing layer, a lithographic hardmask (e.g., SiARC, SiN, SiON, etc.), and a photoresist. It should be appreciated that the lithographic hardmask may include a plurality of layers. The photoresist may be formed by patterning using any suitable lithographic process. Then, using a suitable material removal process, the hardmask, the top electrode 136, the MTJ stack 132, and the pedestal 130 are patterned using lithography, RIE, and/or IBE processes to the create the MTJ pillars.

Figure 6:
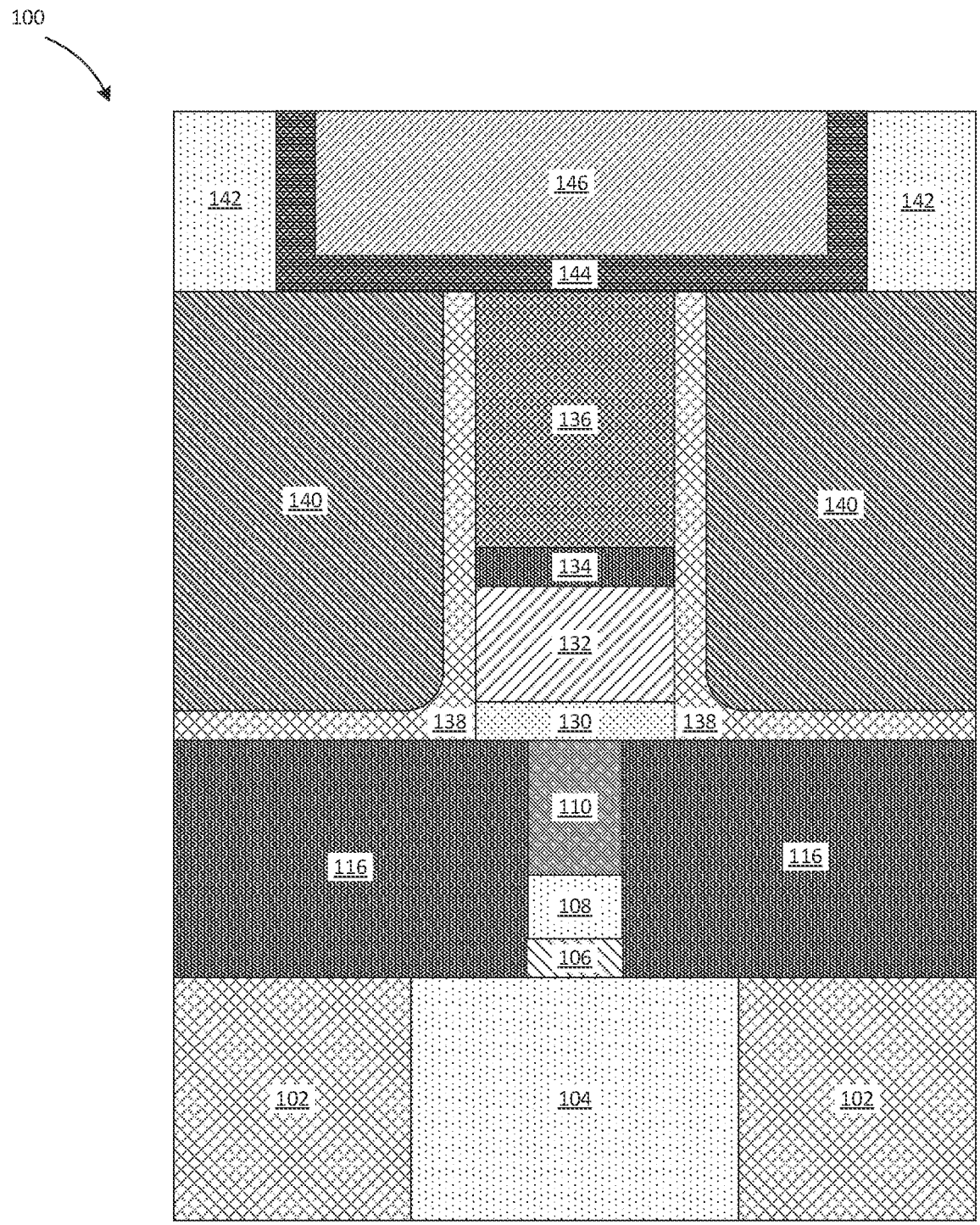
FIG. 6 is a cross-sectional view of the semiconductor device of FIG. 5 after additional fabrication operations, according to embodiments.

Referring now to FIG. 6, this figure is a cross-sectional view of the semiconductor device 100 of FIG. 5 after additional fabrication operations, according to embodiments. As shown in FIG. 6, a dielectric encapsulation layer 138 is formed over the entire semiconductor device 100. The dielectric encapsulation layer 138 may include, for example, SiN, SiBCN, SiCN, SiOCN or SiON, or any other suitable dielectric material. One purpose of the dielectric encapsulation layer 138 is to isolate the tunnel barrier layer of the MTJ stack 132 from the outside environment. As shown in FIG. 6, a dielectric fill layer 140 is formed in and around the MTJ pillars. In certain examples, the formation of the dielectric fill layer 140 may be an oxide based dielectric material that may be formed by an aggressive deposition process. Thus, the dielectric encapsulation layer 140 may help protect the tunnel barrier layer from damage during such a process. A CMP process may be performed to planarize the upper surface of the semiconductor device 100. Then, as shown in FIG. 6, a second dielectric layer 142 is formed on the dielectric encapsulation layer 138 and a via is formed in this second dielectric layer 142 by any suitable combination of processes that are known to a person of skill in the art. A top contact liner layer 144 may first be formed in the vias. Then, a first top contact 146 (or bit-line metal layer) is formed in the remainder of the via in the memory area above the top contact liner layer 144.

Figure 7:
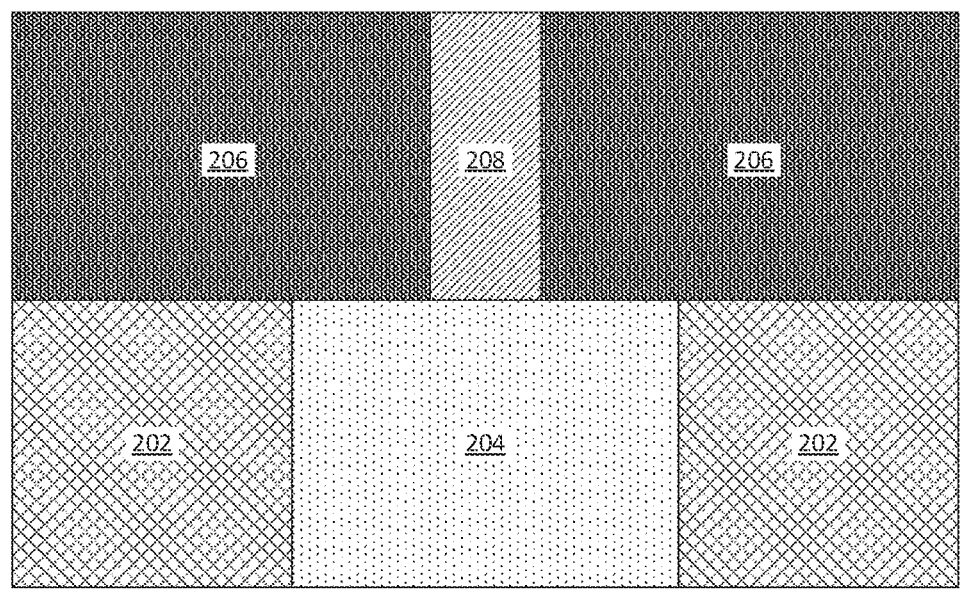
FIG. 7 is a cross-sectional view of a semiconductor device at an intermediate stage of the manufacturing process, according to embodiments.

Referring now to FIG. 7, an exemplary method of manufacturing a semiconductor device 200 (i.e., an MRAM device) to which the present embodiments may be applied is shown. The embodiments shown in FIGS. 7-12 are similar in certain respects to the MRAM devices shown in FIGS. 1-10, however the method of manufacturing includes forming the doped SiGeSn via by first recessing an existing via and then depositing the SiGeSn in that via. In certain examples, several back end of line ("BEOL") layers and front end of line (FEOL) layers may be formed. In general, the front-end-of-line (FEOL) is the first portion of IC fabrication where the individual devices (transistors, capacitors, resistors, etc.) are patterned in the semiconductor. FEOL generally covers everything up to (but not including) the deposition of metal interconnect layers. In general, the BEOL is the second portion of IC fabrication where the individual devices (transistors, capacitors, resistors, etc.) are interconnected with wiring on the wafer. The BEOL metal layers (not shown) can include, for example, Cu, TaN, Ta, Ti, TiN, or a combination thereof. A BEOL dielectric layer (not shown) may be formed on the sides of one or more of the BEOL metal layers. The BEOL dielectric layer may be composed of, for example, $SiO_x$, $SiN_x$, SiBCN, low-K, NBLOK, or any other suitable dielectric material. The structure including the FEOL/BEOL layers may be a starting structure upon which the MRAM devices are formed.

As shown in the semiconductor device 200 of FIG. 7, a first dielectric layer 202 (e.g., in the BEOL) is provided as a base layer into which an interconnect structure of the semiconductor device 200 may be formed. The first dielectric layer 202 may include, for example, $SiO_x$, $SiN_x$, SiBCN, NBLOK, TEOS, low-κ or ultra-low-κ (ULK) materials, etc. In certain embodiments, an interconnect structure (not shown) may be included in one of the BEOL layers. In the example of FIG. 7, the first dielectric layer 202 may be formed in an x'th level BEOL layer. As shown in FIG. 7, a first metal layer 204 (e.g., a Mx layer metal) is formed. The first metal layer 204 may comprise, for example, Cu, TaN, Ta, Ti, TiN or a combination thereof. In these embodiments, the metallic etch stop layer 106 described above with respect to the embodiments in FIGS. 1-6 is not formed on the first dielectric layer 202. Then, a via dielectric layer 206 is formed on the first dielectric layer 202 and the first metal layer 204. In certain embodiments, the via dielectric layer 206 may comprise one or more of, for example, SiN, $SiO_x$, SiBCN, SiCOH, etc. However, it should be appreciated that any other suitable dielectric materials may be used to form the via dielectric layer 206 (or fill dielectric layer). Then, a bottom via conductor layer 208 (or conductive via) is formed over the first metal layer 204. The bottom via conductor layer 208 may comprise one or more suitable conductive materials such as Cu, Ta, TaN, W, etc, and is surrounded by the via dielectric layer 206.

Figure 8:
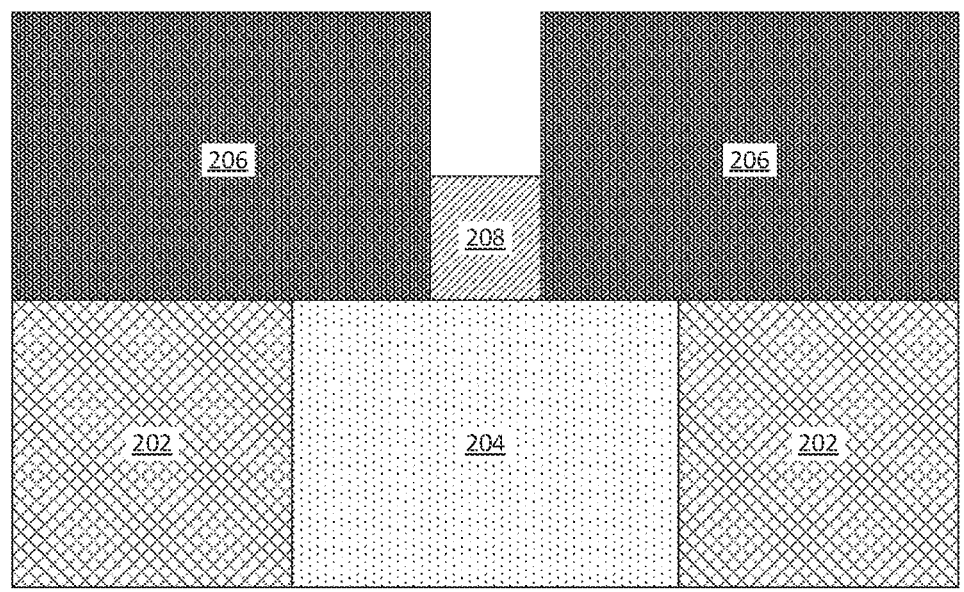
FIG. 8 is a cross-sectional view of the semiconductor device of FIG. 7 after additional fabrication operations, according to embodiments.

Referring now to FIG. 8, this figure is a cross-sectional view of the semiconductor device 200 of FIG. 7 after additional fabrication operations, according to embodiments. As shown in FIG. 8, a suitable material removal process (e.g., wet etching, RIE, or a combination thereof) is performed to recess an upper surface of the bottom via conductor layer 208.

Figure 9:
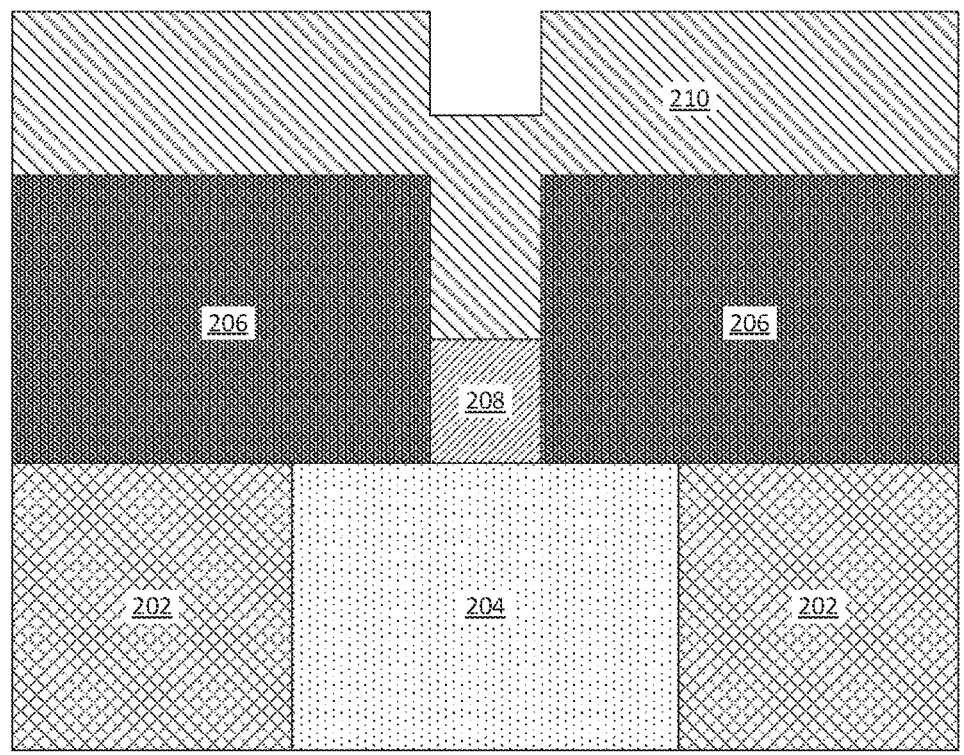
FIG. 9 is a cross-sectional view of the semiconductor device of FIG. 8 after additional fabrication operations, according to embodiments.
Figure 10:
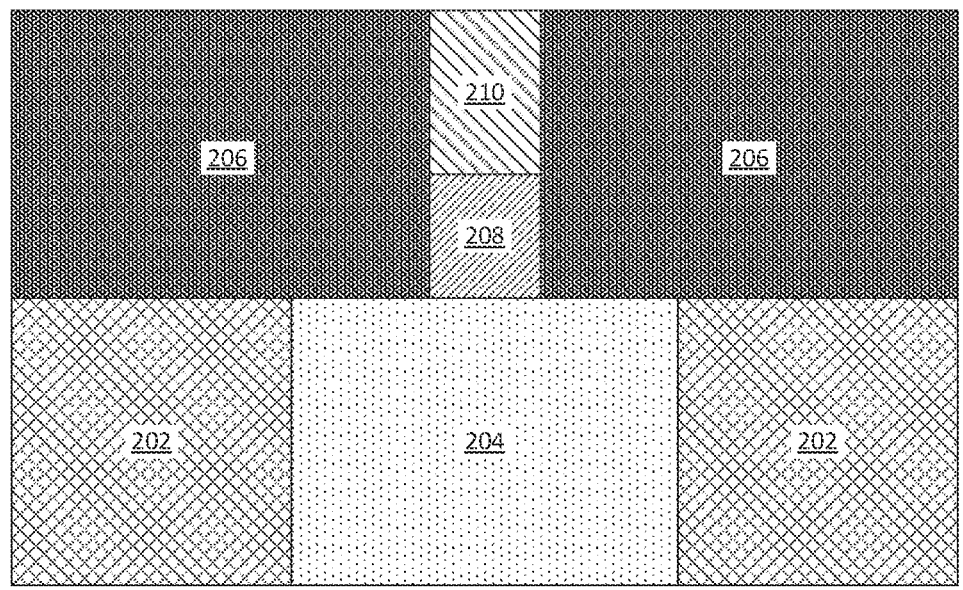
FIG. 10 is a cross-sectional view of the semiconductor device of FIG. 9 after additional fabrication operations, according to embodiments.

Referring now to FIG. 9, this figure is a cross-sectional view of the semiconductor device 200 of FIG. 8 after additional fabrication operations, according to embodiments. As shown in FIG. 9, a thin heavily doped SiGeSn layer 210 is formed on the bottom via conductor layer 208. The SiGeSn layer 210 may be metallic or a doped semiconductor material. Any excess material of the SiGeSn layer 210 may be removed with CMP to planarize the semiconductor device 200 and to expose the upper surface of the via dielectric layer 206, as shown in FIG. 10. One structural difference between the semiconductor device shown in FIG. 10 and the semiconductor device 100 shown in FIG. 4 is the absence of the metallic etch stop layer 106.

Figure 11:
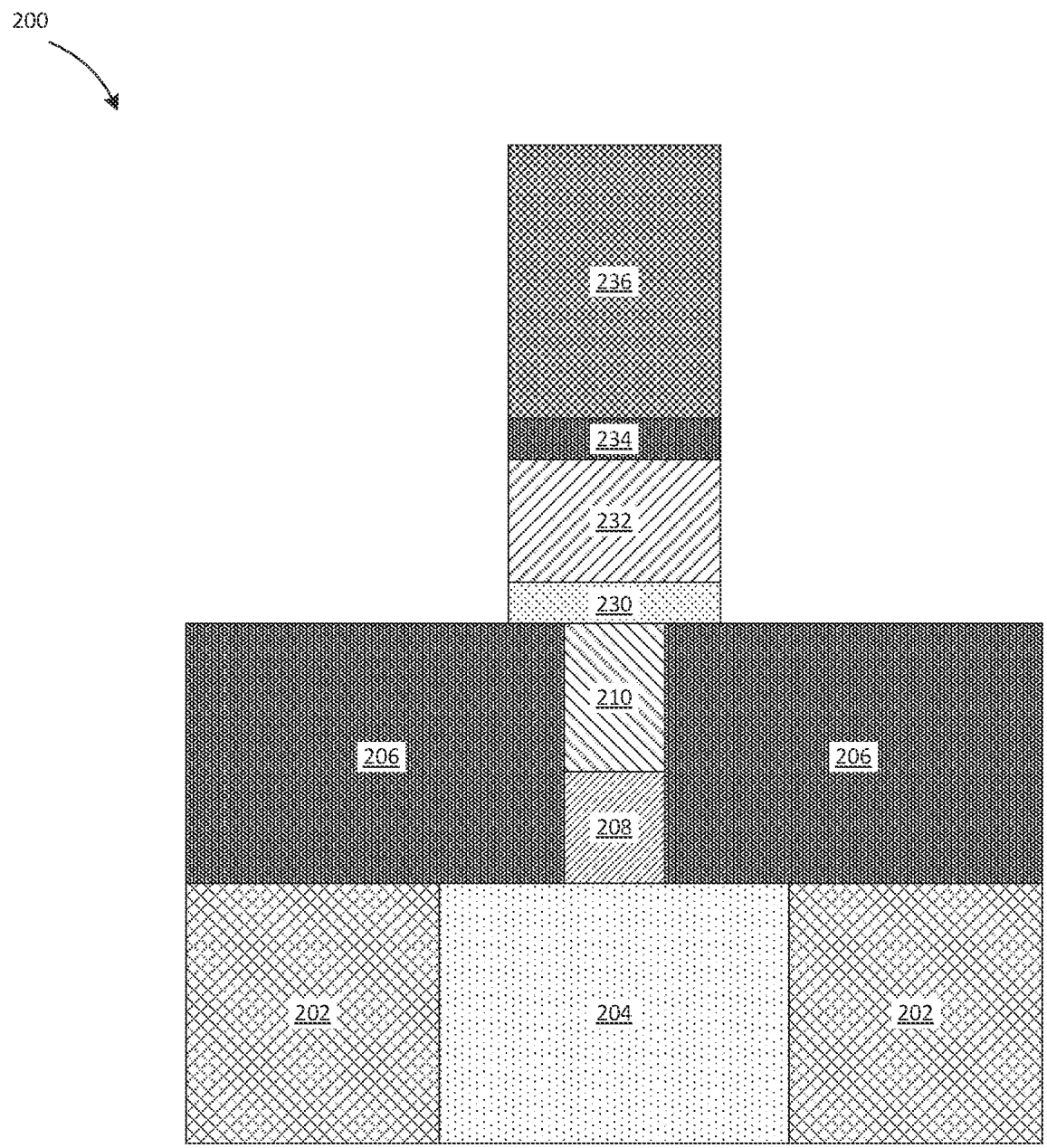
FIG. 11 is a cross-sectional view of the semiconductor device of FIG. 10 after additional fabrication operations, according to embodiments.

Referring now to FIG. 11, this figure is a cross-sectional view of the semiconductor device 200 of FIG. 10 after additional fabrication operations, according to embodiments. As shown in FIG. 11, a pedestal 230 is formed on the SiGeSn layer 210 and on the via dielectric layer 206. In certain embodiments, the pedestal 230 is comprised of the same heavily doped (i.e., (i.e., p++) SiGeSn material as the SiGeSn layer 210. However, it should be appreciated that in other embodiments the pedestal 230 may comprise other materials. In certain examples, the pedestal 230 is wider than the SiGeSn layer 210.

As also shown in FIG. 11, an MTJ stack 232 is formed on the pedestal 230. In general, the MTJ stack 232 may include a magnetic free layer, a tunnel barrier layer and a reference layer (not shown). In general, the magnetic free layers have a magnetic moment or magnetization that can be flipped. In certain embodiments, the tunnel barrier layer is a barrier, such as a thin insulating layer or electric potential, between two electrically conducting materials. Electrons (or quasi-particles) pass through the tunnel barrier by the process of quantum tunneling. In certain embodiments, the tunnel barrier layer includes at least one sublayer composed of MgO. The reference layer (or fixed layer) may, for example, be annealed in a magnetic field to set a polarization state of the reference layer in the MTJ stack 232. In certain embodiments, each layer of the MTJ stack 232 may have a thickness less than an angstrom to a thickness of several angstroms or nanometers. Examples of typical materials in an MTJ stack can include MgO for the tunnel barrier layer, CoFeB for the free layer, and a plurality of layers comprised of different materials for the reference layer. It should be appreciated that the MRAM material stack (MTJ stack) is not limited to these materials, or the layers described above. That is, the MRAM material stack can be composed of any known stack of materials used in MRAM devices. Moreover, it should be appreciated that the MTJ stack 232 may include additional layers, omit certain layers, and each of the layers may include any number of sublayers. In certain embodiments, the MTJ stack 232 can have a combination of ferro and anti-ferromagnetic metals such as Co/Fe/Ni, other metals such as Pt/Ir as well as B. In certain embodiments, the tunnel barrier layer may comprise materials such as MgO, MgAlOx, AlOx, etc.

Next, as shown in FIG. 11, an etch stop metal layer 234 is formed on MTJ stack 232. The etch stop metal layer 234 may comprise, for example, Ru. Then, a top electrode 236 is formed on the etch stop metal layer 234. In certain embodiments, the top electrode 236 is comprised of the same heavily doped (i.e., $p^{++}$) SiGeSn material as the SiGeSn layer 210. However, it should be appreciated that in other embodiments the top electrode 236 may comprise other materials. In certain embodiments, a hardmask (not shown) such as a dielectric hardmask is formed on the top electrode 236. In certain embodiments, the hardmask is a multilayer hardmask. At least initially, the hardmask is formed over the entire semiconductor device 200 as a continuous layer. In certain examples, the material of the hardmask may be TEOS or any other suitable material(s). For example, the hardmask may include one or more of the following materials: TEOS, SiN, SiC, SiON, SiCN etc. Then, a lithographic mask (not shown) is formed that may be used to pattern the MRAM stack. In one example, the lithographic mask is a tri-layer mask including an organic planarizing layer, a lithographic hardmask (e.g., SiARC, SiN, SiON, etc.), and a photoresist. It should be appreciated that the lithographic hardmask may include a plurality of layers. The photoresist may be formed by patterning using any suitable lithographic process. Then, using a suitable material removal process, the hardmask, the top electrode 236, the MTJ stack 232, and the pedestal 230 are patterned using lithography, RIE, and/or IBE processes to the create the MTJ pillars.

Figure 12:
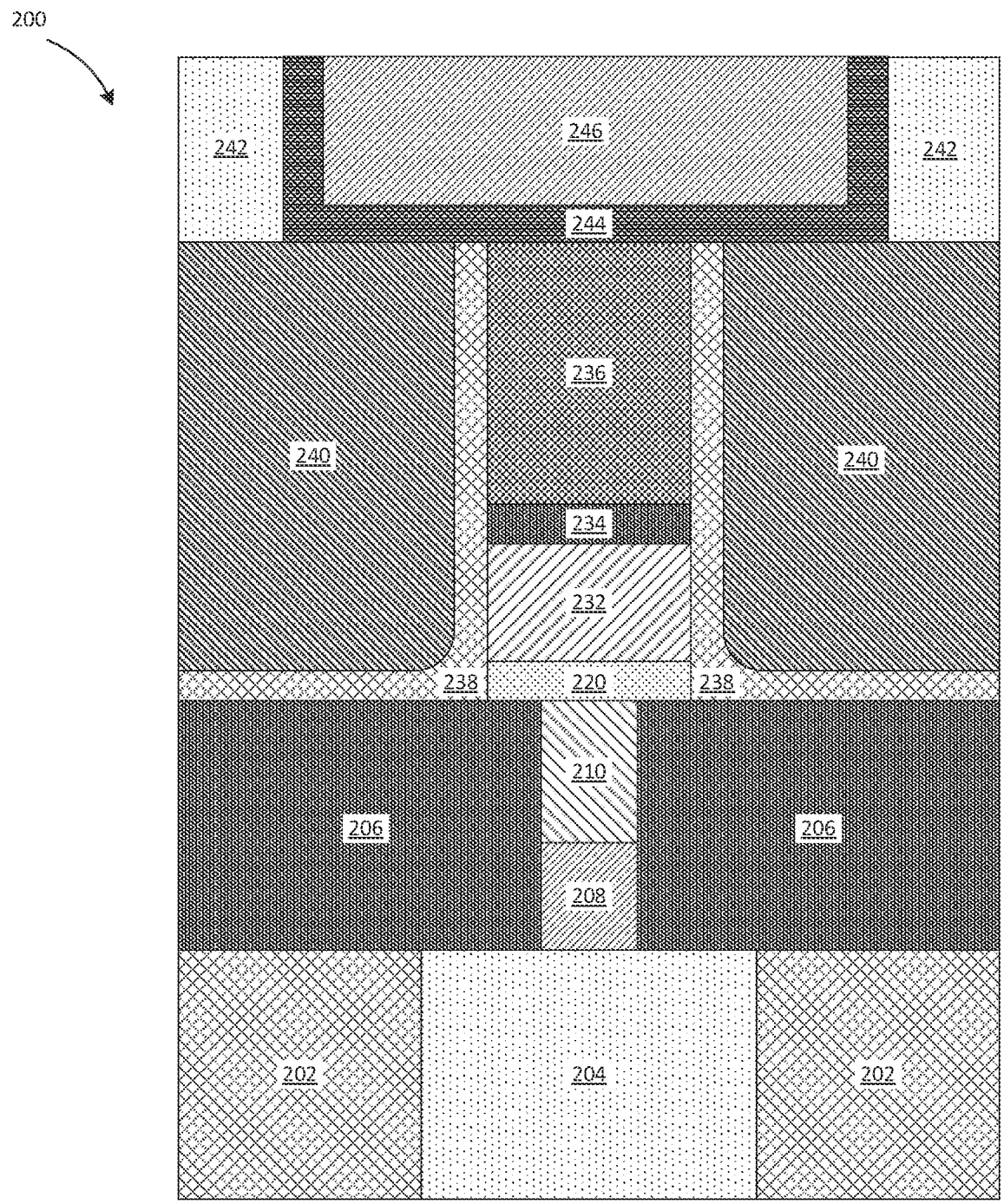
FIG. 12 is a cross-sectional view of the semiconductor device of FIG. 11 after additional fabrication operations, according to embodiments.

Referring now to FIG. 12, this figure is a cross-sectional view of the semiconductor device 200 of FIG. 11 after additional fabrication operations, according to embodiments. As shown in FIG. 12, a dielectric encapsulation layer 238 is formed over the entire semiconductor device 200. The dielectric encapsulation layer 238 may include, for example, SiN or SiCN (H), or any other suitable dielectric material. One purpose of the dielectric encapsulation layer 238 is to isolate the tunnel barrier layer of the MTJ stack 232 from the outside environment. As shown in FIG. 12, a dielectric fill layer 240 is formed in and around the MTJ pillars. In certain examples, the formation of the dielectric fill layer 240 may be an oxide based dielectric material that may be formed by an aggressive deposition process. Thus, the dielectric encapsulation layer 238 may help protect the tunnel barrier layer from damage during such a process. A CPM process may be performed to planarize the upper surface of the semiconductor device 200. Then, as shown in FIG. 12, a second dielectric layer 242 is formed on the dielectric encapsulation layer 238 and a via is formed in this second dielectric layer 242 by any suitable combination of processes that are known to a person of skill in the art. A top contact liner layer 244 may first be formed in the vias. Then, a first top contact 246 (or bit-line metal layer) is formed in the remainder of the via in the memory area above the top contact liner layer 244.

In the present embodiments, the temperature rise for a range of thermal conductivity for doped-SiGeSn (K=3-10 W/mK) was simulated and compared with a Cu micro-stud for a bottom electrode of a 60 nm tall MTJ (which is 20 nm smaller than MTJ CD), leading to a considerable temperature rise of bottom electrode based on first order calculations, assuming a power of ~48 uW during switching of the MTJ. The simulations show that is it possible to achieve electrical resistivity of below 1000 uOhm-cm for heavily boron doped SiGeSn, as this material offers higher mobility than Si at comparable solid solubility of Boron. Simulations below show the via resistance as a function of via CD for SiGeSn resistivity as parameter. The simulations show that the electrical resistance penalty is not comparable to MTJ resistance, and is manageable for a circuit, making SiGeSn a viable option for the STT MRAM bottom electrode, especially at aggressively scaled MTJ dimensions. Also, in the present embodiments, there is no need to change process steps that are adjacent to the MTJ, and therefore no perturbation to the MTJ in the manufacturing process. Also, there are no changes to the structure of the MTJ stack. Moreover, there is not the need to form additional structures to generate heat, resulting in a compact design of the MTJ device. Also, thermal isolation is provided by the doped semiconductor material of the SiGeSn layers. Therefore, the doped SiGeSn semiconductor contacts have good electrical conduction properties but poor thermal conduction properties while maintaining BEOL compatible deposition temperatures.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
a bottom electrode;
a magnetic tunnel junction (MTJ) stack on the bottom electrode; and
a top electrode on the MTJ stack,
wherein at least the top electrode includes doped SiGeSn.

2. The semiconductor device according to claim 1, further comprising a pedestal between the bottom electrode and the MTJ stack, wherein the pedestal includes doped SiGeSn.

3. The semiconductor device according to claim 2, wherein the pedestal is wider than the bottom electrode.

4. The semiconductor device according to claim 2, wherein the pedestal, and the bottom electrode also include doped SiGeSn.

5. The semiconductor device according to claim 1, wherein the doped SiGeSn is doped with boron.

6. The semiconductor device according to claim 1, further comprising a bottom via conductor layer under the bottom electrode.

7. The semiconductor device according to claim 6, further comprising a metallic etch stop layer under the bottom via conductor layer.

8. The semiconductor device according to claim 7, wherein the metallic etch stop layer comprises Ru.

9. The semiconductor device according to claim 1, wherein the bottom electrode includes at least one conductive layer connected to a back end of line (BEOL) metal layer.

10. The semiconductor device according to claim 1, further comprising a dielectric encapsulation layer formed around the MTJ stack.

11. A method of forming a semiconductor device, the method comprising:
forming a bottom electrode;
forming a magnetic tunnel junction (MTJ) stack on the bottom electrode; and
forming a top electrode on the MTJ stack,
wherein at least the top electrode includes doped SiGeSn.

12. The method according to claim 11, further comprising forming a pedestal between the bottom electrode and the MTJ stack, wherein the pedestal includes doped SiGeSn.

13. The method according to claim 12, wherein the pedestal is wider than the bottom electrode.

14. The method according to claim 12, wherein the pedestal and the bottom electrode also include doped SiGeSn.

15. The method according to claim 11, wherein the doped SiGeSn is doped with boron.

16. The method according to claim 11, further comprising forming a bottom via conductor layer under the bottom electrode.

17. The method according to claim 11, further comprising:
   forming a bottom via conductor layer on a first metal layer;
   recessing an upper portion of the bottom via conductor layer; and
   forming the bottom electrode in a recess formed in the upper portion of the bottom via conductor layer.

18. The method according to claim 11, further comprising:
   forming a metallic etch stop layer on a first metal layer;
   forming a bottom via conductor layer on the metallic etch stop layer; and
   forming the bottom electrode on the bottom via conductor layer.

19. The method according to claim 11, wherein the bottom electrode includes at least one conductive layer connected to a back end of line (BEOL) metal layer.

20. The method according to claim 11, further comprising forming a dielectric encapsulation layer around the MTJ stack.

\* \* \* \* \*